(12) United States Patent
Miyagi

(10) Patent No.: US 6,344,667 B1
(45) Date of Patent: Feb. 5, 2002

(54) WIRING BOARD WITH REDUCED RADIATION OF UNDESIRED ELECTROMAGNETIC WAVES

(75) Inventor: Takeshi Miyagi, Fujisawa (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/221,120

(22) Filed: Dec. 28, 1998

(30) Foreign Application Priority Data

Mar. 2, 1998 (JP) .......................... 10-049417
Mar. 3, 1998 (JP) .......................... 10-050779

(51) Int. Cl.$^7$ ............................................. H01L 27/10
(52) U.S. Cl. ...................... 257/207; 257/664; 257/691
(58) Field of Search ................................ 257/207, 691, 257/664, 665

(56) References Cited

U.S. PATENT DOCUMENTS

| | | | | |
|---|---|---|---|---|
| 4,583,111 A | * | 4/1986 | Early | 257/207 |
| 4,731,643 A | * | 3/1988 | Dunhan et al. | 257/207 |
| 5,378,925 A | * | 1/1995 | Sasaki | 257/207 |
| 5,602,406 A | * | 2/1997 | Okabe | 257/207 |

FOREIGN PATENT DOCUMENTS

JP 2778576 5/1998

\* cited by examiner

*Primary Examiner*—Roy Potter
(74) *Attorney, Agent, or Firm*—Oblon, Spivak, McClelland, Maier & Neustadt, P.C.

(57) ABSTRACT

On an insulated substrate, subwires are provided along both sides of a main wire, and further, an inverse signal of a signal input to the main wire is input to the subwires, and in addition, the voltage amplitude of the inverse signal is set to more than 0.3 and less than 0.8 of the amplitude of the input signal.

15 Claims, 10 Drawing Sheets

WIRING BOARD WITH REDUCED RADIATION OF UNDESIRED ELECTROMAGNETIC WAVES

BACKGROUND OF THE INVENTION

The present invention relates to a semiconductor device, a semiconductor package and a semiconductor module wherein radiation of undesired electromagnetic waves is controlled.

With the development of multimedia, there are increasing demands for high-speed data processing and high-speed data transmission. To meet these demands, research and development is actively being carried out into both hardware and software, and there have been noticeable improvements in performance.

In particular, in the field of semiconductor technology, there has been progress in increasing the speed and performance of a microprocessor, the nucleus of a computer, and increasing memory speed and capacity, and high-speed data processing and data transmission is now possible even with an inexpensive personal computer.

However, as a result of increased high-speed and high performance of LSI, undesired electromagnetic waves radiated from electronic equipment have become stronger, increasing together with frequencies, and it is feared that these may have an adverse influence not only on other electronic equipment but also on human beings.

Most radiation of undesired electromagnetic waves is caused by noise occurring between signal wires and the power layer and ground layer due to signal reflection and crosstalk between wires, switching of semiconductor elements and the like, in a circuit board comprising electronic components such as LSI or passive components mounted on a wiring board. This noise causes undesired electromagnetic waves to be radiated from the circuit board, as well as outside the device through heat-dissipation holes or the like in the case.

This radiation of undesired electromagnetic waves divides into waves radiated from the surface of a substrate when a high-speed signal, such as a clock signal, propagates through a circuit pattern formed on the substrate, and waves radiated from the sides of the substrate as a result of resonance between the power layer and the ground layer.

As described in "Methods for Reducing Unwanted Emission Originating in the Power Layer and Ground Layer of a Printed Wiring Board" in the collection of lectures and papers of the 11th Circuit Mounting Technology Lecture Meeting, wave radiation caused by resonance between the power layer and the ground layer can be controlled by providing insulating layers on each side of the power layer to insulate the power layer from the ground layer.

On the other hand, as for instance described in Jpn. Pat. Appln. KOKAI Publication No. 8-228055, wave radiation from the surface of a substrate on which a circuit pattern is formed can be controlled by a shield method wherein a copper paste is applied to the surface of the circuit pattern, with a solder resist in between, and this copper paste is connected to ground.

Furthermore, as disclosed in Jpn. Pat. Appln. KOKAI Publication No. 9-18099, there is another known method wherein, signal wires are provided symmetrically on both sides of a ground wire, so that electromagnetic waves arising from the signal wires cancel each other out, thereby preventing the generation of the undesired electromagnetic waves themselves.

However, with regard to reliability and performance, the above methods have had the following problems. The shield method using copper paste proposed in Jpn. Pat. Appln. KOKAI Publication No. 8-228055 has reliability problems, since weak contact between the copper paste and the solder resist can cause peeling.

On the other hand, the method of symmetrically providing signal wires on both sides of a ground wire so that electromagnetic waves arising from the signal wires cancel each other out, proposed in Jpn. Pat. Appln. KOKAI Publication No. 9-18099, has performance problems since the reduction effect of radiated electromagnetic waves is less than 10%.

In addition, undesired electromagnetic waves are radiated from electronic components, such as a connector, mounted on a printed board. This is mainly a result of the fact that the wires on the printed board and the pin structure inside the connector, provided roughly at a right angle to the printed board, constitute an antenna.

Proposed countermeasures include, as disclosed in Jpn. Pat. Appln. KOKAI Publication No. 9-199235, controlling noise radiation by inserting a ring-shaped core into the connector, or, as disclosed in Jpn. Pat. Appln. KOKAI Publication No. 9-82420, providing a conductive cover over the outer wall of the connector before connecting it to ground, thereby shielding the pin inside the connector and controlling leakage and radiation of electromagnetic waves.

However, these various conventional techniques require a special connector structure and consequently increase the cost of the connector. Since a great number of connectors are used in a semiconductor device, an increase in the cost of connectors leads to a considerable increase in the cost of the semiconductor device.

Furthermore, another cause of radiation of undesired electromagnetic waves from a printed wiring board is a through-hole portion (wherein a signal transmission path is provided within a through-hole). That is, a through-hole portion, and a wiring pattern on the board surface which is connected to the through-hole portion, together produce a structure which has the same configuration as a microstrip antenna, and consequently electromagnetic waves radiate from the through-hole portion.

However, in conventional technology, it has been difficult to control radiation of undesired electromagnetic waves from a through-hole portion.

As regards undesired electromagnetic waves radiating from the mount structure of a semiconductor component, the problem of radiation from the pin portion is revealed in, for instance, B-4-17 in the collection of lectures and papers of the 1997 Lecture Meeting of the Electronic Data Communication Academy Communications Society.

However, as pointed out in edition 114 (pp.72 to 77) of the Environmental Electromagnetic Engineering Special Magazine EMC, a present-day semiconductor package structure does not control radiation of electromagnetic waves, and since there have been no specific suggestions for improvement or patent applications, this problem remains to be solved.

But, undesired electromagnetic waves are radiated from a semiconductor package because wires provided on a wiring board and leads of the semiconductor package together form a structure which acts as an antenna.

Here, it is technically possible to reduce radiation of undesired electromagnetic waves by changing the shape of the leads, but since specifications of semiconductor components, including lead shapes, are defined by world standards, it is extremely difficult and time-consuming to change the shape of leads.

However, due to increasing world-wide restrictions on the environmental problem of unwanted electromagnetic wave radiation, there is a demand in present standard specifications for a method of controlling radiation of electromagnetic waves.

BRIEF SUMMARY OF THE INVENTION

Accordingly, a first object of the present invention is to provide a semiconductor device capable of reducing radiation of undesired electromagnetic waves without loss of reliability.

A second object of the present invention is to provide a semiconductor device wherein radiation of undesired electromagnetic waves from a connector can be controlled without increasing the cost of the connector.

A third object of the present invention is to provide a semiconductor device wherein radiation of electromagnetic waves from a through-hole portion can be controlled.

A fourth object of the present invention is to provide a semiconductor package wherein radiation of undesired electromagnetic waves can be controlled and a semiconductor device using the same.

A fifth object of the present invention is to provide a semiconductor module wherein radiation of undesired electromagnetic waves can be controlled.

In order to achieve the above first object, the semiconductor device of the present invention comprises a first signal wire provided on a substrate; a pair of second signal wires provided along both sides of the first signal wire on the substrate; an inverse signal of an input signal, which is input to the first signal wire, is input to the second signal wires, and in addition, when the amplitude of the input signal is V1 and the amplitude of the inverse signal is V2, the relation 0.3 V1≦V2≦0.8 V1 is satisfied.

According to research conducted by the present inventor, by providing second signal wires on both sides of the first signal wire and inputting to the second signal wires an inverse signal of the signal inputting to the first signal wire, while also setting the voltage amplitude of the inverse signal to more than 0.3 and less than 0.8 of the voltage amplitude of the input signal, it is possible to adequately control radiation of undesired electromagnetic waves.

Furthermore, according to such a technique for controlling radiation of undesired electromagnetic waves, basically it is only necessary to add a wire for inverse signal and a signal source, and a copper paste is not required, and therefore, unlike the conventional shield method disclosed in Jpn. Pat. Appln. KOKAI Publication No. 8-228055, there is no disadvantage such as loss of reliability due to peeling of copper paste and solder resist.

Therefore, according to the present invention, it is possible to realize a semiconductor device wherein radiation of undesired electromagnetic waves can be controlled, without loss of reliability.

Furthermore, in order to achieve the second object, the semiconductor device of the present invention comprises a signal wire provided on a substrate; a connector having a first connector terminal, provided on the substrate and connected to the signal wire, and at least one second connector terminal, provided next to the first connector terminal; an inverse signal of an input signal, which is input to the first connector terminal, being input to the second connector terminal.

According to such a constitution, an inverse signal, being the inverse of the signal input to the first connector terminal, is input to the second connector terminal, whereby undesired electromagnetic waves radiated from the first and second connector terminals cancel each other out, and consequently undesired electromagnetic waves radiated from the connector can be controlled.

Furthermore, since this technique of controlling radiation of undesired electromagnetic waves can basically be performed by adding a connector terminal and an inverse signal source, it does not require a special connector structure, and consequently increased connector cost can be controlled.

Therefore, according to the present embodiment, radiation of undesired electromagnetic waves from the connector can be controlled without increasing the cost of the connector.

Furthermore, in order to achieve the third object, the semiconductor device of the present invention comprises a first through hole portion, provided in a substrate; at least one second through hole portion, provided in the substrate next to the first through hole portion; an inverse signal of an input signal, which is input to the first through hole portion, being input to the second through hole portion.

According to such a constitution, an inverse signal of the input signal applied to the second through hole portion is input to the first through hole portion, so that undesired electromagnetic waves radiating from the first and second through hole portions cancel each other out, thereby enabling undesired electromagnetic waves radiated from the through hole portions to be controlled. Therefore, according to the present embodiment, a semiconductor device capable of controlling radiation of undesired electromagnetic waves from through hole portions can be realized.

Furthermore, in order to achieve the fourth object, the present invention comprises a semiconductor package for mounting a semiconductor chip, comprising a first signal input portion, which a first signal is input to; and at least one second signal input portion, which an inverse signal of the first signal is input to, provided next to the first signal input portion.

Furthermore, in order to achieve the fourth object, the semiconductor device of the present invention comprises a semiconductor package, provided on a wiring board, and comprising a first signal input portion, which a first signal is input to, and at least one second signal input portion, which an inverse signal of the first signal is input to, provided next to the first signal input portion; and a semiconductor chip, mounted on the semiconductor package.

According to such a constitution, an inverse signal of the signal input to the first signal input portion is input to the second signal input portion, whereby undesired electromagnetic waves radiated from the first and second signal input portions cancel each other out, consequently enabling undesired electromagnetic waves radiating from the signal input portions to be controlled.

Therefore, it is possible to realize a semiconductor package wherein radiation of undesired electromagnetic waves from a signal input portion can be controlled, and a semiconductor device using the semiconductor package.

Furthermore, this technique of controlling radiation of undesired electromagnetic waves can basically be performed merely by adding a signal input portion and a signal source, and there is no need to alter the shape of the signal input portion. Consequently, according to the present invention, radiation of undesired electromagnetic waves can be controlled, even when the signal input portion is determined by world standards, such as, for instance, specification of the leads in the semiconductor package.

Furthermore, in order to achieve the fifth object, a semiconductor module of the present invention comprises a first signal wire provided on a substrate; a pair of second signal wires provided along both sides of the first signal wire on the substrate; an inverse signal of an input signal, which is input to the first signal wire, is input to the second signal wires, and in addition, when the amplitude of the input signal is V1 and the amplitude of the inverse signal is V2, the relation 0.3 V1≦V2≦0.8 V1 is satisfied; a third signal wire, provided on the substrate; and a connector having a first connector terminal, provided on the substrate and connected to the third signal wire, and at least one second connector terminal, provided next to the first connector terminal, an inverse signal of an input signal, which is input to the first connector terminal, being input to the second connector terminal; a first through hole portion, provided in the substrate; at least one second through hole portion, provided in the substrate next to the first through hole portion; an inverse signal of an input signal, which is input to the first through hole portion, being input to the second through hole portion; and a semiconductor package provided on the substrate, comprising a first signal input portion, which a first signal is input to, and at least one second signal input portion, which an inverse signal of the first signal is input to, provided next to the first signal input portion; and a semiconductor chip, mounted on the semiconductor package.

According to such a constitution, undesired electromagnetic waves radiating from the signal wire, the connectors, the through hole portions and the semiconductor package, which are main sources of undesired electromagnetic waves, can be controlled, and therefore, radiation of undesired electromagnetic waves from the semiconductor module can be effectively and adequately reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

There will be detailed below the preferred embodiments of the present invention (hereinafter "embodiments") with reference to the accompanying drawings.

Embodiment 1

Figure 1:
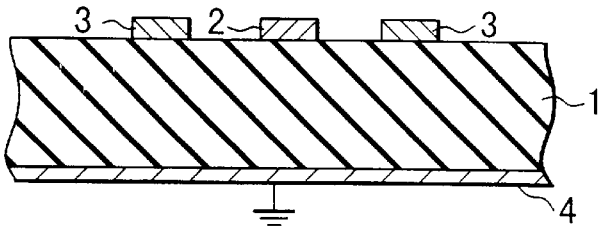
FIG. 1 is a cross-sectional view of a wiring board according to a first embodiment of the present invention.

FIG. 1 is a cross-sectional view of a wiring board according to a first embodiment of the present invention. A multilayer board, such as a printed wiring board, is generally used as a wiring board, but to facilitate explanation, the following explanation refers to a wiring board with a microstrip route structure.

In FIG. 1 represents an insulated substrate comprising insulating material such as glass epoxy or BT, and a first signal wire (hereinafter "main wire") 2, which a high-speed signal (input signal) such as a clock signal propagates along, is provided on this insulated substrate 1. Furthermore, a pair of signal wires (hereinafter "subwires") 3 are provided along both sides of the main wire 2 on the insulated substrate 1. Then, ground potential is joined to the underface of the insulated substrate 1, with a ground layer provided in between.

Here, in a conventional high-speed signal transmission system, a subwire, which an inversion of the high-speed signal travels along, is provided on one side of the main wire, but in the present embodiment, subwires 3 are provided on both sides of the main wire 2.

This is because, when subwires 3 are provided on both sides of the main wire 2 and an inverse signal (described later) is applied to the main wire 2, radiated noise can be reduced by more than 10 dB$\mu$V compared to a case when an inverse signal is applied to a single subwire provided on one side of the main wire.

Figure 2A:
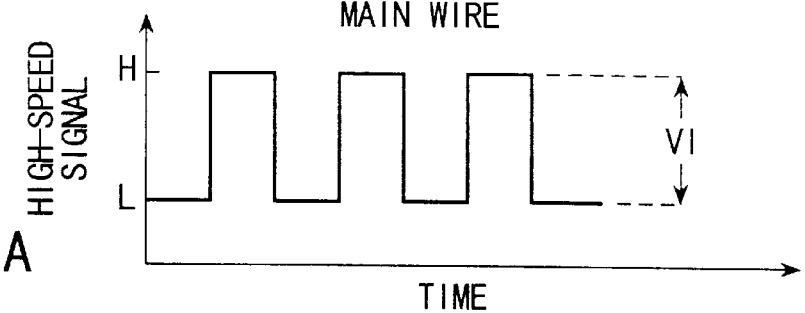
FIG. 2A and FIG. 2B are diagrams showing a high-speed signal applied to a main wire of the wiring board and an inverse signal applied to a subwire.
Figure 2B:
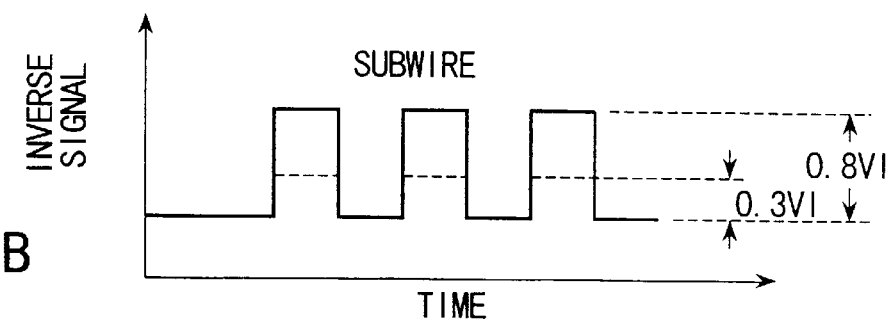

In the present embodiment, as shown in FIG. 2A and FIG. 2B, an inverse signal, which is 180 degrees out of phase with the high-speed signal applied to the main wire 2, and has a voltage amplitude of more than 0.3 and less than 0.8 of the voltage amplitude V1 of the high-speed signal, is applied to the subwires 3.

In the system mentioned above, where an inverse signal is applied to a single subwire provided on one side of the main wire, although the inverse signal is 180 degrees out of phase with the high-speed signal, it has the same amplitude as the high-speed signal.

Figure 3:
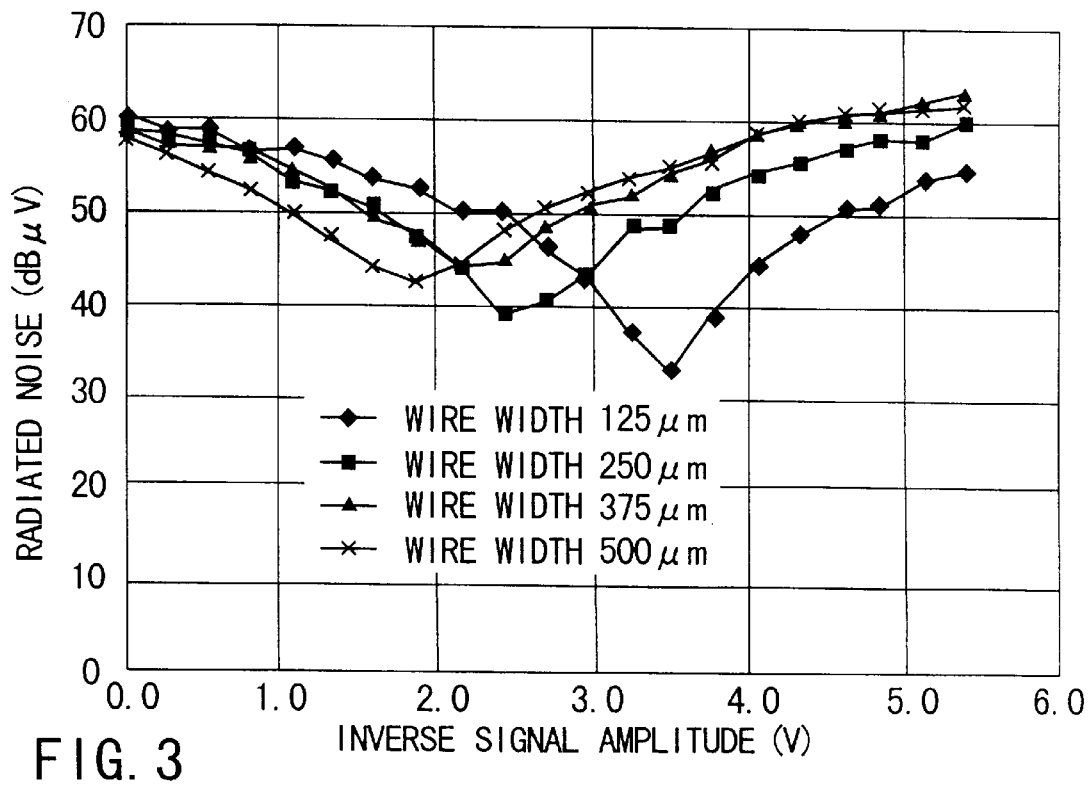
FIG. 3 is a diagram showing the relation between radiated noise and inverse signal amplitude detected when a high-speed signal having voltage amplitude of 5V was applied to the main wire, and inverse signal amplitude was altered within a range of 0.0 to 6.0V, in cases where the width of the main wire is 125 μm, in cases where the width of the subwire was 125 μm, 250 μm, 375 μm and 500 μm.

FIG. 3 shows the relation between radiated noise and inverse signal amplitude detected when a high-speed signal having voltage amplitude of 5V was applied to the main wire 2, and an inverse signal having voltage amplitude (hereinafter "inverse signal amplitude") altered within a range of 0.0 to 6.0V was applied to the subwire 3, in cases where the width of the main wire was 125 $\mu$m, and the width of the subwire 3 was 125 $\mu$m, 250 $\mu$m, 375 $\mu$m and 500 $\mu$m.

As shown in FIG. 3, at each wire width, radiated noise level initially decreases as the inverse signal amplitude increases, then, when the inverse signal amplitude exceeds a certain value, the radiated noise level rises as the inverse signal amplitude decreases. That is, FIG. 3 illustrates that radiated noise level has a minimum value with respect to inverse signal amplitude.

Therefore, in order to obtain a minimum value with any wire width, need only be applied to the subwire 3 an inverse signal with a voltage amplitude of more than 0.3 and less than 0.8 of the voltage amplitude of the high-speed signal, applied to the main wire 2.

Furthermore, it can be seen that in the most effective case, namely when wire width is 125 $\mu$m and the inverse signal amplitude is 3.5V, noise level can be reduced by more than 30 dB$\mu$V.

According to such an embodiment, by providing subwires 3 on both sides of the main wire 2 and inputting to the subwires 3 an inverse signal of the signal input to the main wire 2, while also setting the voltage amplitude of the inverse signal to more than 0.3 and less than 0.8 of the voltage amplitude of the input signal, it is possible to adequately control radiation of undesired electromagnetic waves.

Moreover, unlike the conventional technique for controlling radiation of undesired electromagnetic waves, basically comprising adding a subwire 3 and an inverse signal source and requiring a copper paste (Jpn. Pat. Appln. KOKAI Publication No. 8-228055), there is no disadvantage such as loss of reliability due to peeling of the copper paste and the solder resist. Furthermore, since inverse signal amplitude need only be made less than the amplitude of the high-speed signal, increase of power consumption can also be controlled.

Thus, according to the present embodiment, a wiring board can be realized wherein radiation of undesired electromagnetic waves, which have a great effect on people and electronic equipment, can be reduced without reduced reliability or increased power consumption, thereby contributing to solving the environmental electromagnetic problem which has become a world-wide issue in recent years.

FIG. 1 shows only three wires 2 and 3, but multiple units of these three wires 2 and 3 may be provided.

Embodiment 2

Figure 4A:
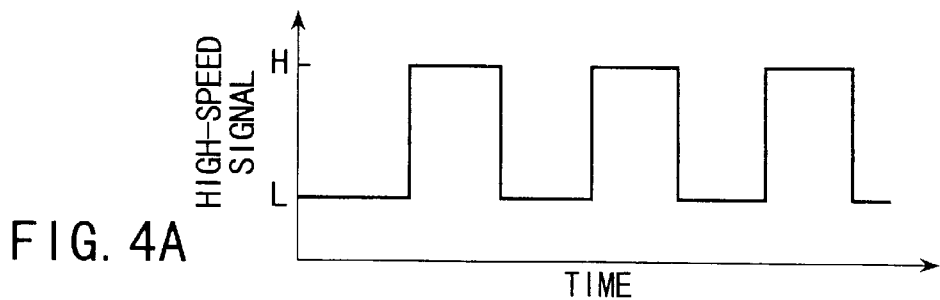
FIG. 4A and FIG. 4B are diagrams showing a high-speed signal applied to a main wire and an inverse signal applied to a subwire of a wiring board according to a second embodiment.
Figure 4B:
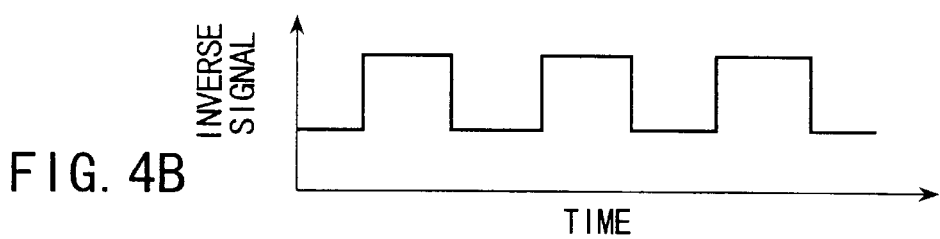

As shown in FIG. 4A and FIG. 4B, the second embodiment differs from the first embodiment in that the inverse signal applied to the subwires 3 has a phase deviating within a range of ±90 degrees from the phase of the high-speed signal applied to the main wire 2, and in addition, has voltage amplitude less than the voltage amplitude of the high-speed signal.

Figure 5:
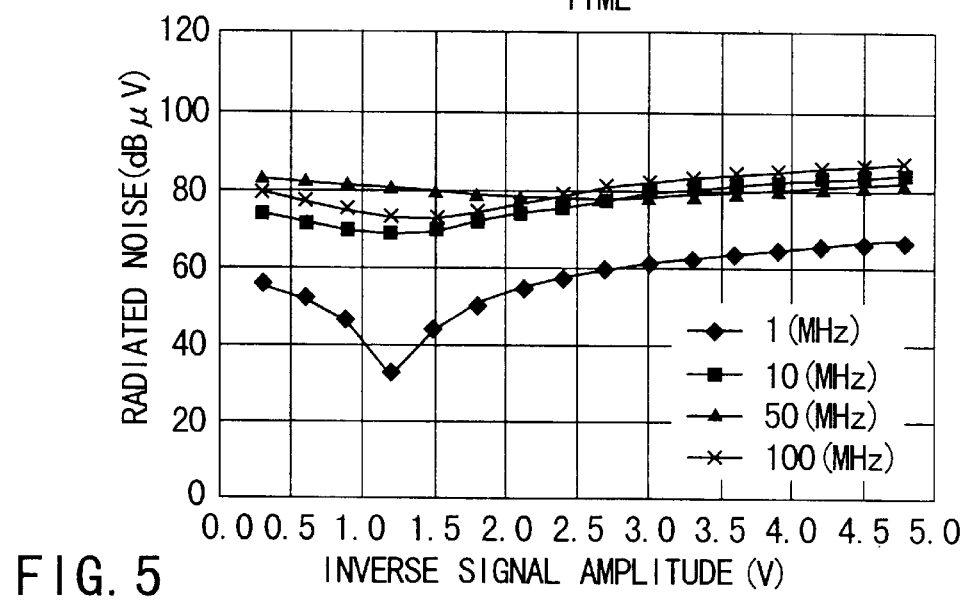
FIG. 5 is a diagram showing the relation between radiated noise and inverse signal amplitude detected near a wiring board when the phase difference between a high-speed signal, applied to a main wire, and an inverse signal is zero degrees, in cases where the clock frequency of the high-speed signal is 1 MHz, 10 MHz, 50 MHz and 100 MHz.

FIG. 5 shows the relation between radiated noise near the wiring board (near field) and inverse signal amplitude when the phase difference between the high-speed signal and the inverse signal is zero degrees, in cases where the clock frequency of the high-speed signal applied to the main wire 2 is 1 MHz, 10 MHz, 50 MHz and 100 MHz.

Figure 6:
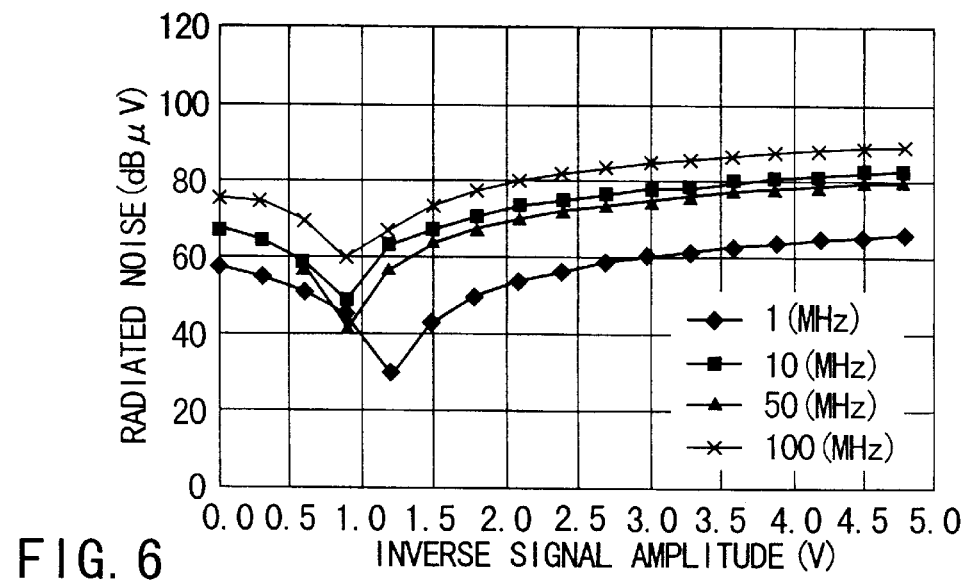
FIG. 6 is a diagram showing the relation between radiated noise near a wiring board and inverse signal amplitude detected when the phase difference between a high-speed signal, applied to a main wire, and an inverse signal differs within a range of ±90 degrees, in cases where the clock frequency of the high-speed signal is 1 MHz, 10 MHz, 50 MHz and 100 MHz.

Furthermore, FIG. 6 is a diagram showing the relation between radiated noise near a wiring board and inverse signal amplitude detected when the phase difference between a high-speed signal, and an inverse signal differs within a range of ±90 degrees, in cases where the clock frequency of the high-speed signal applied to a main wire 2, is 1 MHz, 10 MHz, 50 MHz and 100 MHz.

In FIG. 5 and FIG. 6, noise radiated near the wiring board was measured with an electromagnetic probe. Furthermore, the wire width of the main wire 2 and the subwires 3 was 125 $\mu$m, the distance between the main wire 2 and the subwires 3 was 250 $\mu$m, and the voltage amplitude of the high-speed signal applied to the main wire 2 was 3.3V. Furthermore, a glass epoxy substrate of thickness 0.5 mm was used as the insulated substrate 1.

As shown in FIG. 5, in a case where there is zero phase difference between the high-speed signal and the inverse signal, when the clock frequency is 1 MHz, the inverse signal has a considerable effect of reducing radiated noise even with zero phase difference, but when the clock frequency is greater than 10 MHz, the radiated noise reduction effect of the inverse signal is inadequate.

On the other hand, as shown in FIG. 6, in a case where the phase difference between the high-speed signal and the inverse signal varies within a range of ±90 degrees, adequate reduction of radiated noise is achieved even when the clock frequency is 100 MHz. In the tested frequency band, it was confirmed that a radiated noise reduction effect was obtained within a range of ±90 degrees (excluding 0 degrees).

According to the present embodiment, by providing subwires 3 on both sides of the main wire 2, inputting to the subwires 3 a signal which is inverse to the high-speed signal input to the main wire 2, reducing the voltage amplitude of this inverse signal to less than the voltage amplitude of the high-speed signal, and also differing the phase difference between the inverse signal and the high-speed signal within a range of ±90 degrees, radiation of undesired electromagnetic waves can be adequately controlled. In addition, the same effects as in the first embodiment are obtained.

Embodiment 3

Figure 7:
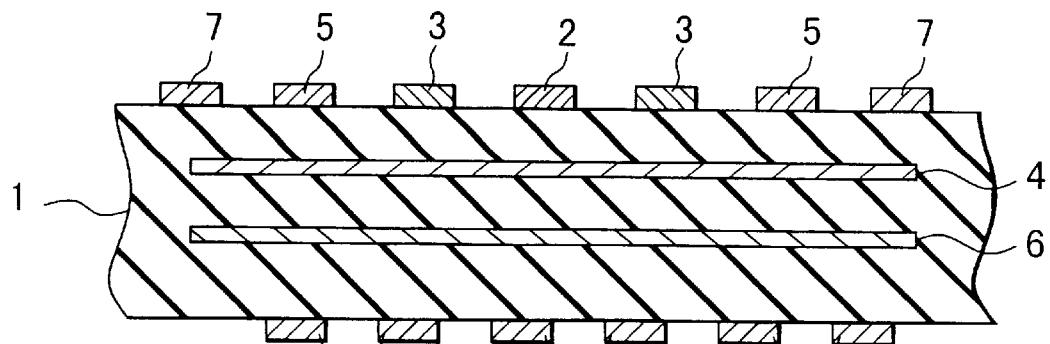
FIG. 7 is a cross-sectional view of a wiring board according to a third embodiment of the present invention.

FIG. 7 is a cross-sectional view of a wiring board according to a third embodiment of the present invention. Here, an example in which the present invention is applied in a conventional four-layer printed wiring board will be explained. Like members to FIG. 1 are designated by like reference characters, and detailed explanation thereof is omitted.

As in the first embodiment, the main wire 2 and subwires 3 are provided on the insulated substrate 1. Copper is used as the material for these wires 2 and 3. Furthermore, ground wires 5 are provided on top of the insulated substrate 1 on the outer sides of the subwires 3. A ground layer 4 and a power layer 6 are provided inside the insulated substrate 1.

In FIG. 7 represents main wires (for instance, clock signal wires) other than the main wire 2, that is, signal wires which are not subject to control of radiation of undesired electromagnetic waves.

Even when many signal wires are provided in this manner, subwires 3, which an inverse signal propagates through, need only be provided on both sides of the main wire 2, but more preferably, when ground wires 5, that is, wires secured to a fixed voltage such as ground potential, are provided between the other main wires (signal wires) adjacent to the subwires 3, as in the present embodiment, mutual interference of adjacent main wires can be controlled and circuit malfunctions can be prevented.

In the present embodiment, as in the first embodiment, by inputting an inverse signal to the subwires 3, and in addition, setting the voltage amplitude of the inverse signal to more than 0.3 and less than 0.8 of the voltage amplitude of the input signal, it is possible to adequately control radiation of undesired electromagnetic waves with no disadvantages such as loss of reliability.

As shown in FIG. 7, many printed boards comprise a ground layer 4 and a power layer 6 provided inside an insulated substrate 1, the main wire 2 and the like being provided on the surface of the substrate, but the present invention is effective even when the main wire 2 and the like is provided inside the insulated substrate 1.

Embodiment 4

The fourth embodiment differs from the third embodiment in that, similar to the second embodiment shown in FIG. 4A and FIG. 4B, an inverse signal, having a phase deviating within a range of ±90 degrees from the phase of a high-speed signal applied to the main wire 2, and in addition, having voltage amplitude less than the voltage amplitude of the high-speed signal, is applied to the subwires 3.

When the four-layer printed wiring board of the present embodiment was applied to a drive circuit board of a liquid crystal display with a clock frequency of approximately 30 MHz, it was confirmed that noise radiated near the drive circuit board was reduced by up to 30 dB$\mu$V.

Furthermore, when the four-layer printed wiring board of the present embodiment was applied to a board for computer with a clock frequency of 100 MHz, it was confirmed that noise radiated near the board for computer was reduced by up to 15 dB$\mu$V.

According to the present embodiment, by providing subwires 3 along both sides of the main wire 2, inputting to the subwires 3 a signal which is inverse to the high-speed signal input to the main wire 2, reducing the voltage amplitude of this inverse signal to less than the voltage amplitude of the high-speed signal, and also differing the phase difference between the inverse signal and the high-speed signal within a range of ±90 degrees, radiation of undesired electromagnetic waves can be adequately controlled. In addition, the same effects as in the first embodiment are obtained.

The present invention can be applied to other types of boards to the one described in Embodiments 1 to 4, such as, for instance, a thick-film multilayer wiring board or a thin-film board for multichip module, a build-up printed board, a ceramic multilayer wiring board, or a semiconductor package comprising a resin board or ceramic board or the like. Furthermore, the present invention can be optimally used depending on the type of board and type of semiconductor or the like mounted thereon.

Embodiment 5

Figure 8:
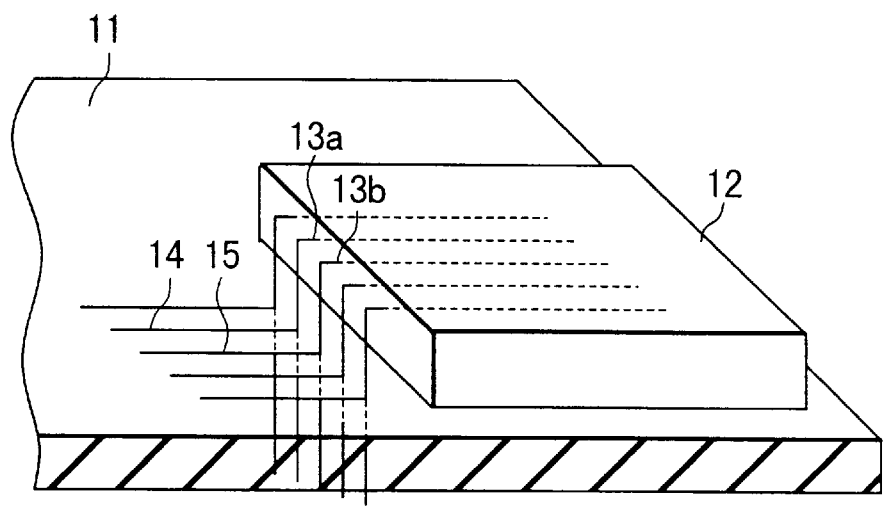
FIG. 8 is a schematic view of a semiconductor device according to a fifth embodiment of the present invention.

FIG. 8 is a schematic view of a semiconductor device according to a fifth embodiment of the present invention.

In FIG. 8, 11 shows a printed board, and a flat cable connector 12 is provided on a printed board 11. The flat cable connector 12 has multiple connector terminals, among which a first connector terminal 13a connects to a high-speed signal wire 14. A high-speed signal, such as a clock signal, is input to the high-speed signal wire 14.

A second connector terminal 13b is provided next to the first connector terminal 13a and connects to an inverse signal wire 15. An inverted signal of the high-speed signal, input to the high-speed signal wire 14, is input to the inverse signal wire 15.

In FIG. 8, one second connector terminal 13b is provided adjacent to one first connector terminal 13a, but two second connector terminals 13b may be provided on both sides of one first connector terminal 13a.

That is, one second connector terminal 13b may be provided on each side of the first connector terminal 13a. Furthermore, depending on the type of connector used, three or more second connector terminals 13b may be provided adjacent to one first connector terminal 13a.

Furthermore, two or more first connector terminals 13a may be provided, in which case at least one or more second connector terminal 13b is provided next to each first connector terminal 13a.

Figure 9:
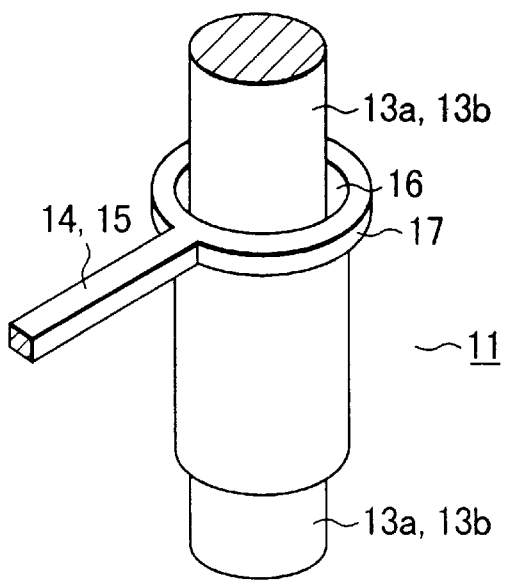
FIG. 9 is an enlarged view of a connection between a first connector and a high-speed signal wire.

FIG. 9 is an enlarged view of a connection between the first connector terminal 13a (13b) and the high-speed signal wire 14 (inverse signal wire 15).

A through hole 16 is formed in a printed board 11. Furthermore, the end portion (connection point) 17 of the high-speed signal wire 14 (inverse signal wire 15) is ring-shaped. The inner wall of the through hole 16 is covered with a conductive film (not shown in the diagram). The first connector terminal 13a (13b) is inserted through the end 17 of the through hole 16, and in addition, is electrically connected to the conductive film (not shown in the diagram) covering the inner wall of the through hole 16 and the ring-shaped end 17 by soldering or the like.

According to the present embodiment, an inverse signal inputting to the first connector terminal 13a, is input to the second connector terminal 13b, whereby undesired electromagnetic waves radiated from the first and second connector terminals 13a and 13b cancel each other out, and consequently undesired electromagnetic waves radiated from the flat cable connector 12 can be controlled.

Furthermore, since this technique of controlling radiation of undesired electromagnetic waves can basically be performed by adding a second connector terminal 13b and an inverse signal source, it does not require a special connector structure, and consequently increased connector cost can be controlled.

Therefore, according to the present embodiment, radiation of undesired electromagnetic waves from the flat cable connector 12 can be controlled without increasing the cost of the flat cable connector 12.

Figure 10:
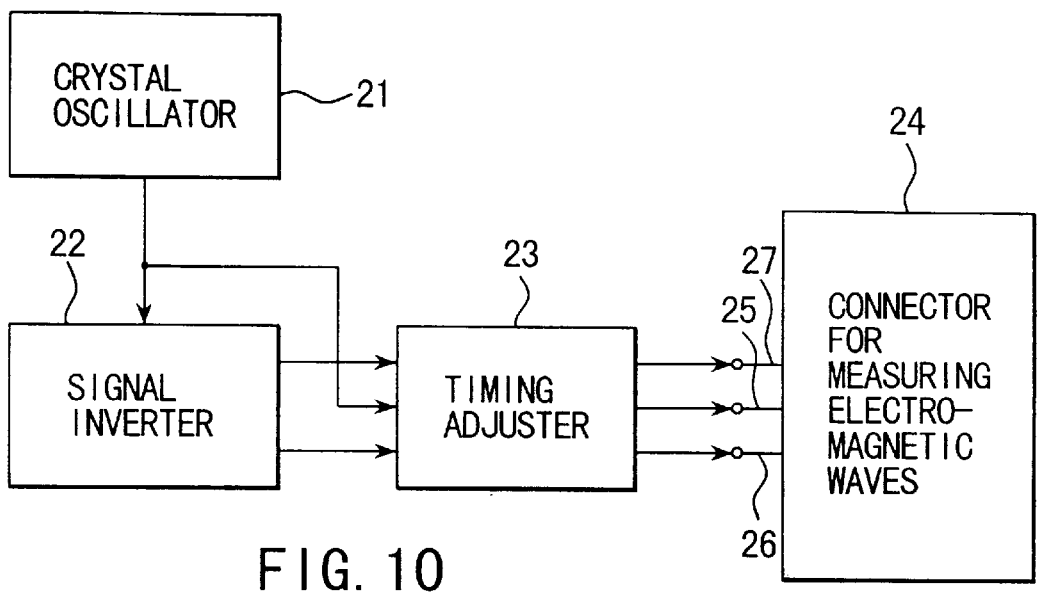
FIG. 10 is a block diagram of a circuit module for investigating undesired electromagnetic waves radiated from the connector structure of FIG. 8.

FIG. 10 is a block diagram of a circuit module used for investigating undesired electromagnetic waves radiated from the connector structure of FIG. 8.

In FIG. 10, 24 corresponds to the connector structure of FIG. 8, and represents a connector for measuring electromagnetic waves, comprising a ten-pin connector for flat cable mounted on a printed board. The wire signal on the printed board is limited to 50 Ω.

Furthermore, in FIG. 10, a crystal oscillator 21 outputs a rectangular signal of 30 MHz.

This rectangular signal is input via a timing adjuster 23 to a central connector terminal 25 of a connector for measuring electromagnetic waves 24. Moreover, an inverse signal of the rectangular signal, inverted by a signal inverter 22, is input via the timing adjuster 23 to connector terminals 26 and 27 on both sides of the connector terminal 25. The phase difference between the rectangular signal and the inverse signal is restricted to 180 degrees ±1 degree.

Electromagnetic waves were measured by using a spectral analyzer to measure the near field of the three connectors 25 to 27.

Figure 11A:
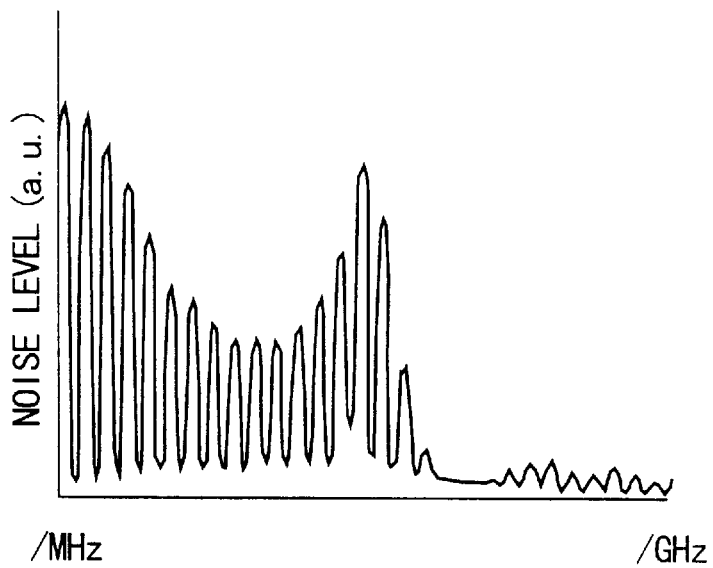
FIG. 11A and FIG. 11B show test results of noise radiation obtained using the circuit module of FIG. 10 in a case where an inverse signal was not applied to both end connector terminals, and in a case where the signal was applied, respectively.
Figure 11B:
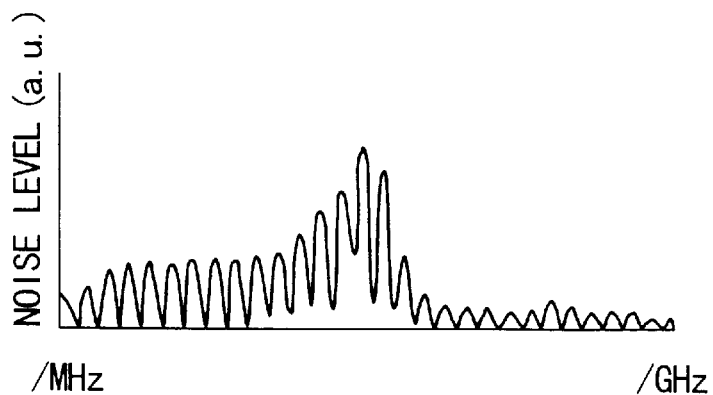

FIG. 11A shows test results of noise radiation obtained using the circuit module when no inverse signal was applied to the end connector terminals 26 and 27 (i.e. conventional technology), that is, when both end connector terminals 26 and 27 were ground potentials. And, FIG. 11B shows test results of noise radiation obtained using the circuit module when an inverse signal was applied to the end connector terminals 26 and 27 (i.e. the present invention). In FIG. 11A and FIG. 11B, the horizontal axis represents frequency (1 MHz to 1 GHz) and the vertical axis represents noise level (a.u.).

As shown in FIG. 11A and FIG. 11B, in comparison with the conventional structure, the connector structure of the present invention reduces noise level in the frequency band 1 MHz to 1 GHz, and undesired electromagnetic waves in the low frequency region, which were numerously generated in the conventional case, are particularly sharply reduced.

These test results show clearly that the connector structure of FIG. 8 is appropriate for reducing undesired electromagnetic waves.

Next, test results relating to the influence on controlling radiation of undesired electromagnetic waves, exerted by the ratio of inverse signal voltage amplitude to high-speed signal voltage amplitude, will be explained.

In tests, the circuit module shown in FIG. 10 was used. Then, the voltage amplitude of the high-speed signal was fixed at 5.0V, while the voltage amplitude of the inverse signal was varied within a range of 0V to 6V, and radiation of electromagnetic waves was measured.

Figure 12:
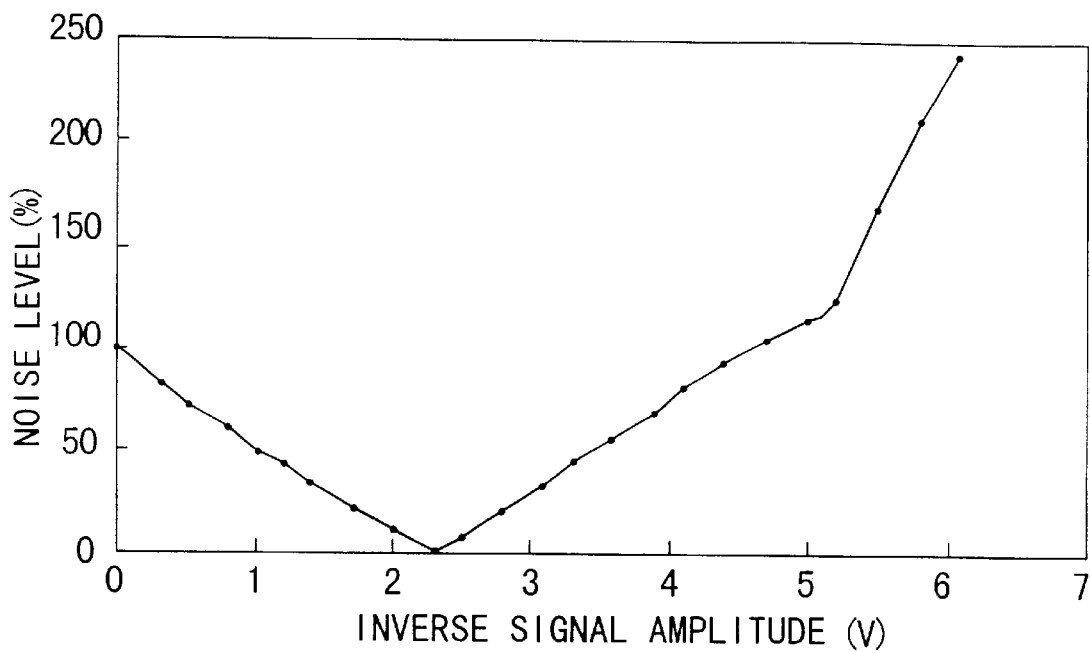
FIG. 12 is a diagram illustrating the relation between noise levels and inverse signal amplitude detected using the circuit module of FIG. 10.

FIG. 12 shows the measurements obtained. It can be seen from FIG. 12 that noise level has minimum value when voltage amplitude is 2.3V, which is less than the 5V voltage amplitude of the high-speed signal. In FIG. 12, the noise level when no inverse signal is input is deemed 100%, and therefore it is possible to reduce noise level to 2% by selecting an appropriate voltage amplitude.

Therefore, in the device of FIG. 8, by optimizing the voltage amplitude of the inverse signal input to the inverse signal wire 15, extremely effective EMI countermeasures can be achieved.

The explanation of the present embodiment referred to a case using a flat cable connector 12, but the present invention can be applied to various pin-terminal connectors, and is especially effective when applied in a connector wherein the pin becomes substantially perpendicular to the board surface when the connector is mounted.

Figure 13:
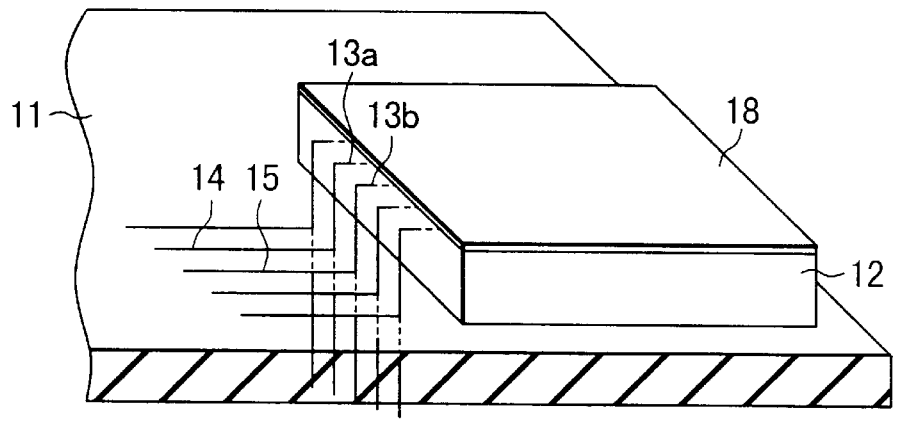
FIG. 13 is a schematic view of a modification of the semiconductor device of FIG. 8.

Furthermore, as shown in FIG. 13, a metallic film or metallic plate 18 may be provided on the flat cable connector 12 in order to obtain matched impedance between the wires 14 and 15 and the connector terminals 13a and 13b.

Embodiment 6

Figure 14:
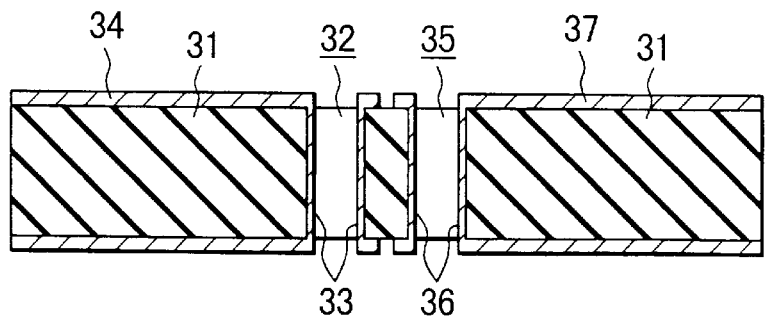
FIG. 14 is a cross-sectional view of a through-hole structure of a semiconductor device according to a sixth embodiment of the present invention.

FIG. 14 is a cross-sectional view of a through-hole structure of a semiconductor device according to a sixth embodiment of the present invention.

In FIG. 14, a first through hole 32 is provided in a double-sided printed board 31.

A first conductive film 33 is provided on the inner wall of the first through hole 32. Furthermore, the first conductive film 33 electrically connects to a high-speed signal wire 34, provided on the double-sided printed board 31, and a high-speed signal such as a clock signal travels through the high-speed signal wire 34. The first through hole 32 and the first conductive film 33 constitute a first through hole portion.

Furthermore, a second through hole 35 is provided in the double-sided printed board 31, in close proximity to the first through hole 32.

A second conductive film 36 is provided on the inner wall of the second through hole 35. Furthermore, the second conductive film 36 electrically connects to an inverse signal wire 37, provided on the double-sided printed board 31, and a high-speed inverse signal such as a clock signal travels through the inverse signal wire 37. The second through hole 35 and the second conductive film 36 constitute a second through hole portion.

According to the present embodiment, an inverse signal of the input signal applied to the second through hole portion is input to the first through hole portion, so that undesired electromagnetic waves radiating from the first and second through hole portions cancel each other out, thereby enabling undesired electromagnetic waves radiated from the through hole portions to be controlled.

Therefore, according to the present embodiment, a semiconductor device capable of controlling radiation of undesired electromagnetic waves from through hole portions can be realized.

Figure 15A:
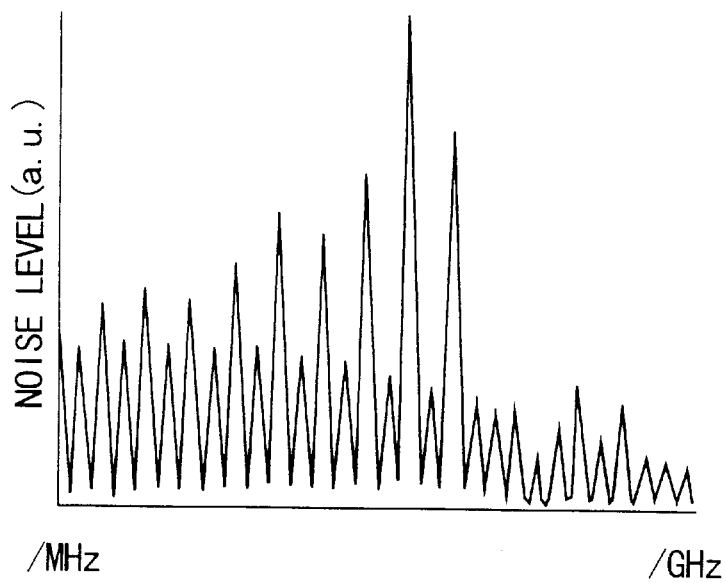
FIG. 15A and FIG. 15B show test results obtained when a conventional through hole structure and a through hole structure of a sixth embodiment were provided in a double-sided printed board comprising glass epoxy, and distributed frequency of undesired electromagnetic waves were investigated in each case.
Figure 15B:
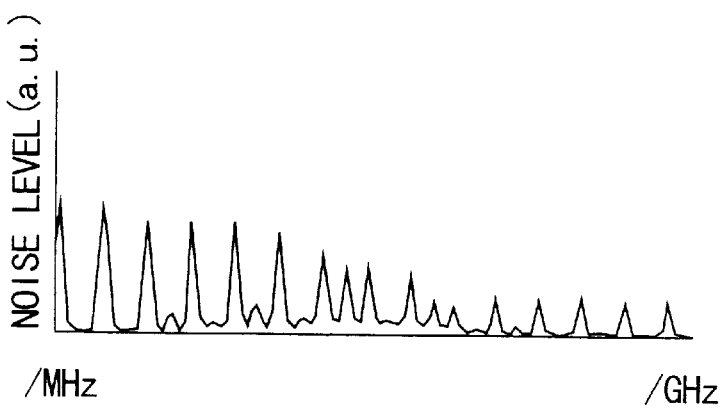

FIG. 15A and FIG. 15B show test results obtained when a conventional through hole structure and a through hole structure of the present invention were provided in a double-sided printed board comprising glass epoxy, and effects of reducing undesired electromagnetic waves were investigated in each case.

FIG. 15A shows results obtained by using a spectral analyzer to measure the strength of the near field of the conventional through hole structure (having only the first through hole portion of FIG. 14). Further, FIG. 15B shows results, measured in the same manner as FIG. 15A, for a double-sided printed board having the first and second through hole portions of the present invention. In FIG. 15A and FIG. 15B, the horizontal axis represents frequency (1 MHz to 1 GHz) and the vertical axis represents noise level (a.u.). From FIG. 15A and FIG. 15B, it can be understood that the through hole structure of the present invention is highly effective in reducing undesired electromagnetic waves.

Embodiment 7

Figure 16:
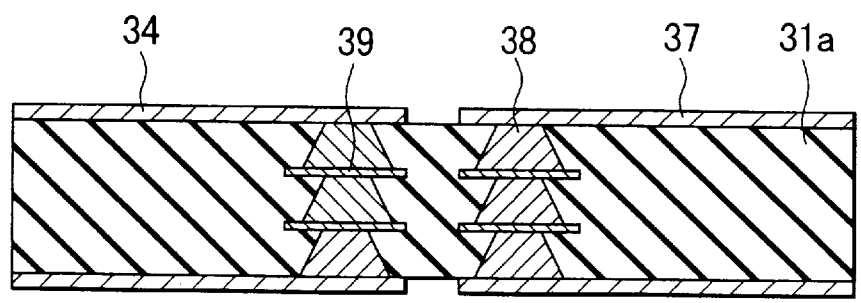
FIG. 16 is a cross-sectional view of a through-hole structure of a semiconductor device according to a seventh embodiment of the present invention.

FIG. 16 is a cross-sectional view of a through-hole structure of a semiconductor device according to a seventh embodiment of the present invention. Like members to FIG. 14 are designated by like reference characters to FIG. 14, and detailed explanation is omitted.

The chief difference of present embodiment from the sixth embodiment is that the signal transmission path in the through hole portion comprises bumps 38 of metal paste, such as copper paste.

As shown in FIG. 16, the signal transmission path has a laminated structure of three bumps 38 with lands 39 provided in between. Then, the present embodiment uses a multilayer printed board 31a, wherein the bumps 38 are used as connections between wires provided on different layers of the printed board 31a.

As in the third embodiment, the present embodiment can considerably reduce undesired electromagnetic waves radiated from the through hole portion.

The explanation of the second and third embodiments referred to a through hole portion running from the surface of the printed board to the underface, but the present invention can, for instance, also be applied to an IVH structure, wherein a via (connecting member) is buried in the board.

Moreover, the present invention is not limited to a printed board, and can for instance be applied to other structural bodies provided with through holes, contact holes or contact rods for connecting layers, such as a thin-film multilayer board for multichip module, a hybrid board made using thick-film technique, a built-up printed board, a ceramic package, a resin package or a conductive chip.

Embodiment 8

Figure 17:
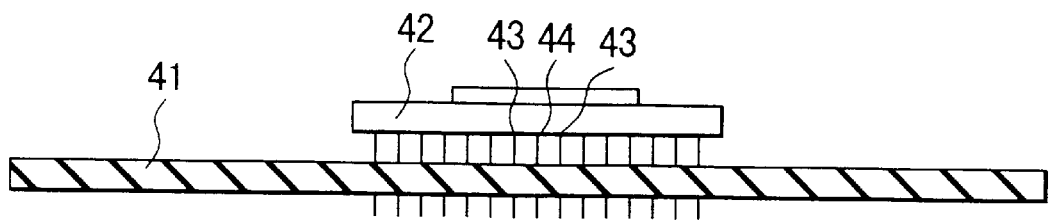
FIG. 17 is a cross-sectional view of a semiconductor device according to an eighth embodiment of the present invention.

FIG. 17 is a cross-sectional view of a semiconductor device according to an eighth embodiment of the present invention.

In FIG. 17, a pin grid array package (PGA) 42, which a semiconductor chip (not shown in the diagram) is mounted on, is provided on a wiring board 41.

The PGA 42 has multiple pin-like leads for inputting and outputting power supply and signals, and a high-speed signal such as a clock signal is input to one of these pin-like leads, a first pin-like lead 43 (first signal input portion). An inverse signal of the high-speed signal is input to a second pin-like lead 44 (second signal input portion), provided next to the first pin-like lead 43.

Multiple first pin-like leads 43 may be provided. In that case, a second pin-like lead 44 is provided next to each first pin-like lead 43. Alternatively, multiple second pin-like leads 44 may be provided next to each first pin-like lead 43. For instance, one second pin-like lead 44 may be provided on each side of the first pin-like lead 43, giving a total of two second pin-like leads 44.

Figure 18:
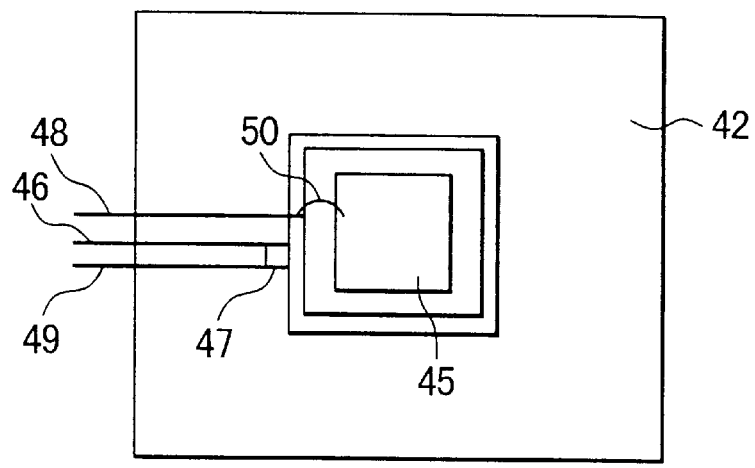
FIG. 18 is a diagram showing the state when inverse signal wires are not connected as far as a semiconductor chip, but terminate inside a PGA.

Here, the inverse signal wire, which the inverse signal is transmitted along, does not connect as far as the semiconductor chip but either terminates inside the PGA 42 or is left open. For instance, as shown in FIG. 18, the inverse signal wire 46 does not connect as far as the semiconductor chip 45, and instead terminates at the resistor 47. In this case, the inverse signal wire 46 should preferably terminate at a resistor 47 having the same resistance as the characteristic impedance of the inverse signal wire 46.

In FIG. 18, 48 represents a high-speed signal wire 48, 49 represents a ground wire or a power wire, and 50 represents a bonding wire.

According to the present embodiment, an inverse signal of the high-speed signal input to the first pin-like lead 43 is input to the second pin-like lead 44 of the PGA 42, whereby undesired electromagnetic waves radiated from the first and second pin-like leads 43 and 44 cancel each other out, consequently enabling undesired electromagnetic waves radiated from the first pin-like lead 43 to be controlled.

Therefore, according to the present embodiment, it is possible to realize a semiconductor device using a PGA 42 wherein radiation of undesired electromagnetic waves from pin-like leads can be controlled. Furthermore, research conducted by the present inventor has shown that considerable reduction of undesired electromagnetic waves can be obtained by keeping the inverse signal at phase difference of 180 degrees ±5 degrees with respect to the high-speed signal.

Figure 19:
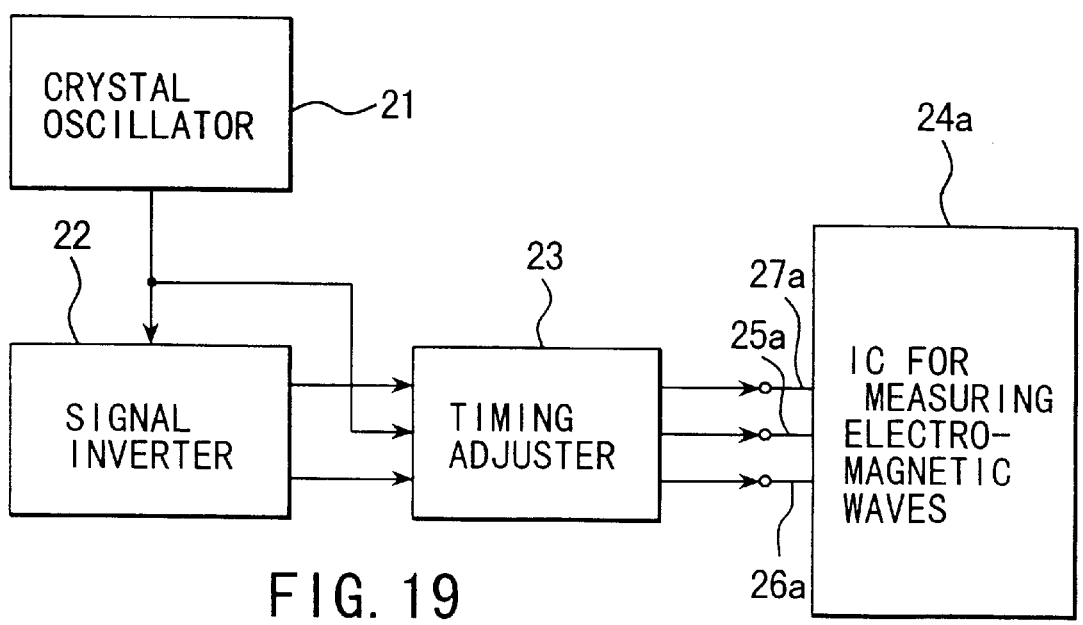
FIG. 19 is a block diagram of a circuit module used in order to investigate undesired electromagnetic waves radiated from the package structure of FIG. 17.

FIG. 19 is a block diagram of a circuit module used to investigate undesired electromagnetic waves radiating from the package structure of FIG. 17. Like members to FIG. 10 are designated by like reference characters, and detailed explanation thereof is omitted.

With the exception of a different object being measured, the constitution of this circuit module is identical to the circuit module of FIG. 10. Here, the object being measured comprises an IC14a for measuring electromagnetic waves, comprising a CMOS.IC (74AC11P), wherein lead terminals 25a to 27a were arranged in parallel, mounted on a printed board. Other parts of the constitution are identical to FIG. 10.

Figure 20A:
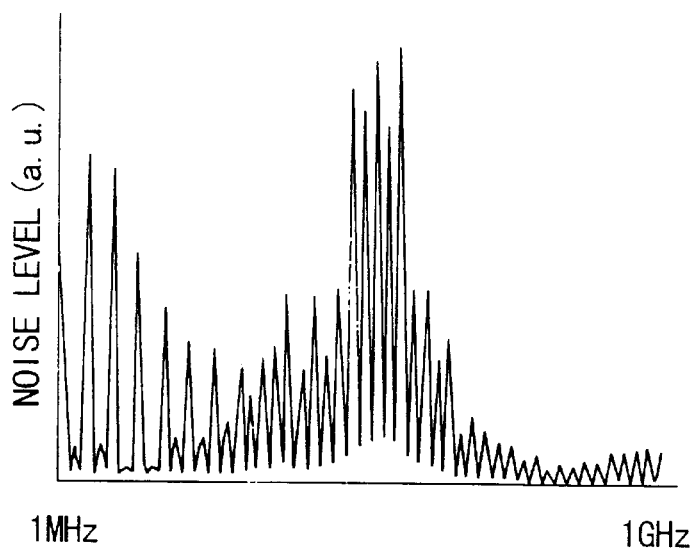
FIG. 20A and FIG. 20B show test results of noise radiation obtained using the module of FIG. 19 in a case where an inverse signal was not applied to both end connector terminals, and a case where the signal was applied, respectively.
Figure 20B:
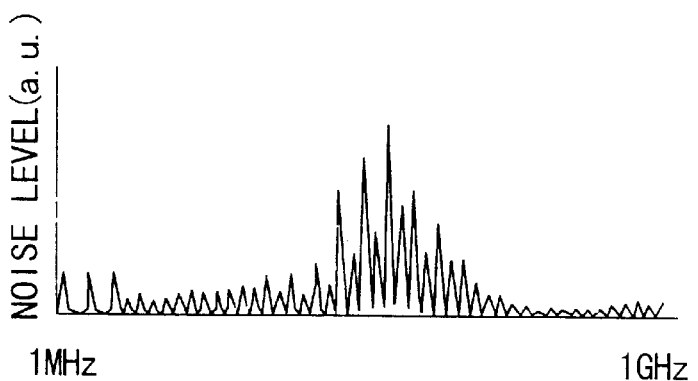

Electromagnetic waves were measured by using a spectral analyzer to measure the near field of the three lead terminals 25a to 27a. FIG. 20A shows test results of noise radiation obtained using the circuit module when no inverse signal was applied to both end lead terminals 26a and 27a (i.e. conventional technology), that is, when both end lead terminals 26a and 27a were ground potentials. And, FIG. 20B shows test results of noise radiation obtained using the circuit module when an inverse signal was applied to both end lead terminals 26a and 27a (i.e. the present invention). In FIG. 20A and FIG. 20B, the horizontal axis represents frequency (1 MHz to 1 GHz) and the vertical axis represents noise level (a.u.).

As shown in FIG. 20A and FIG. 20B, the semiconductor package of the present invention reduces noise level at almost all frequencies when compared to the conventional technology, the peak value showing a reduction of over 60%. These results clearly demonstrate that the semiconductor structure of FIG. 17 is suitable for reducing undesired electromagnetic waves.

Next, test results relating to the influence on controlling the radiation of undesired electromagnetic waves, exerted by the ratio of inverse signal voltage amplitude to high-speed signal voltage amplitude, will be explained.

In tests, the circuit module shown in FIG. 19 was used. Then, the voltage amplitude of the high-speed signal was fixed at 5.0V, while the voltage amplitude of the inverse signal was varied from 0V to 10V, and radiation of electromagnetic waves was measured.

Figure 21:
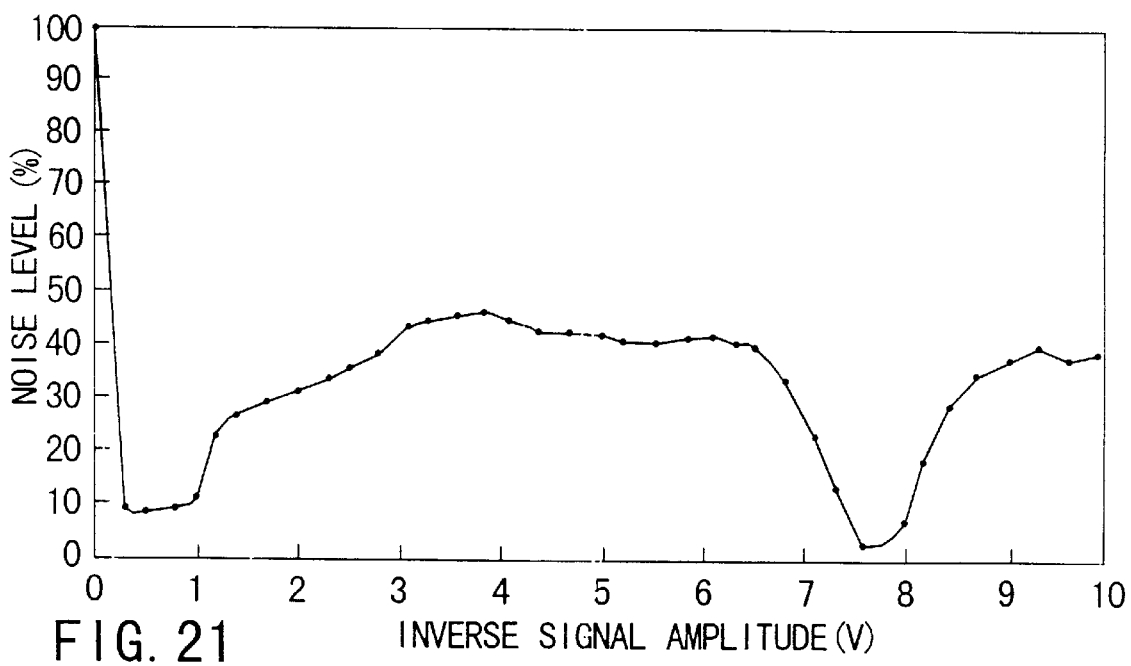
FIG. 21 is a diagram illustrating the relation between noise levels and inverse signal amplitude detected using the circuit module of FIG. 19.

FIG. 21 shows the measurements obtained. It can be seen from FIG. 21 that noise level has minimum value when voltage amplitude is 7.6V, which is greater than the 5V voltage amplitude of the high-speed signal. These results were obtained using a DIP, but this phenomenon was confirmed in all semiconductor packages comprising leads and pins, such as PGA and QFP.

In FIG. 21, the noise level when no inverse signal is input is deemed 100%, and therefore it is possible to reduce noise level to 3% by selecting an appropriate voltage amplitude.

Therefore, in the device of FIG. 17, by optimizing the voltage amplitude of the inverse signal input to the pin-like lead 44, extremely effective EMI counter-measures can be achieved.

Figure 22:
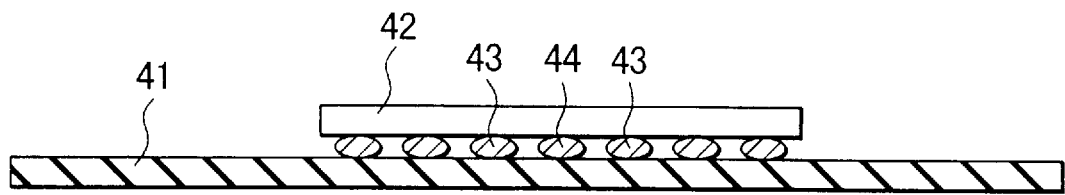
FIG. 22 is a cross-sectional view of a modification of the eighth embodiment.
Figure 23:
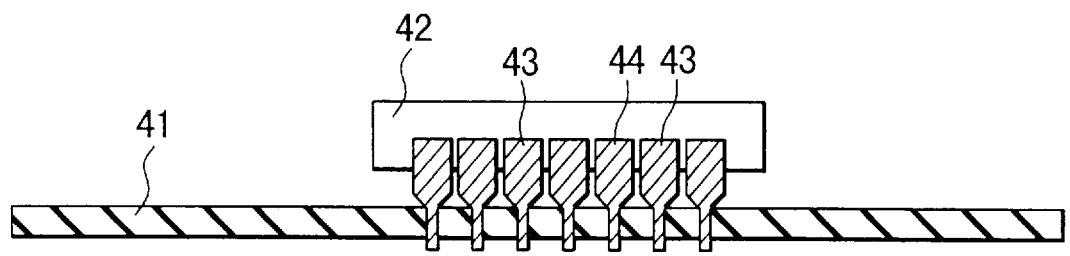
FIG. 23 is a cross-sectional view of another modification of the eighth embodiment.
Figure 24:
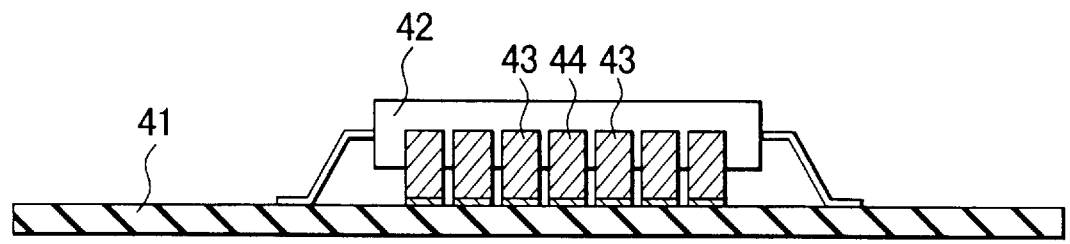
FIG. 24 is a cross-sectional view of yet another modification of the eighth embodiment.

FIG. 22 to FIG. 24 show modifications of the present embodiment. FIG. 22 depicts a modification using a bump grid array (BGA), FIG. 23, a DIP, and FIG. 24, a QFP. Like members to FIG. 17 are designated with like reference numerals.

The present invention can be applied to various semiconductor packages, and in addition to PGA, BGA, DIP and QFP shown in the embodiments and modifications, the present invention can for instance be applied to leads such as a pin-like lead and tape-like lead, and to a semiconductor package using projection-like electrodes.

Embodiment 9

Figure 25:
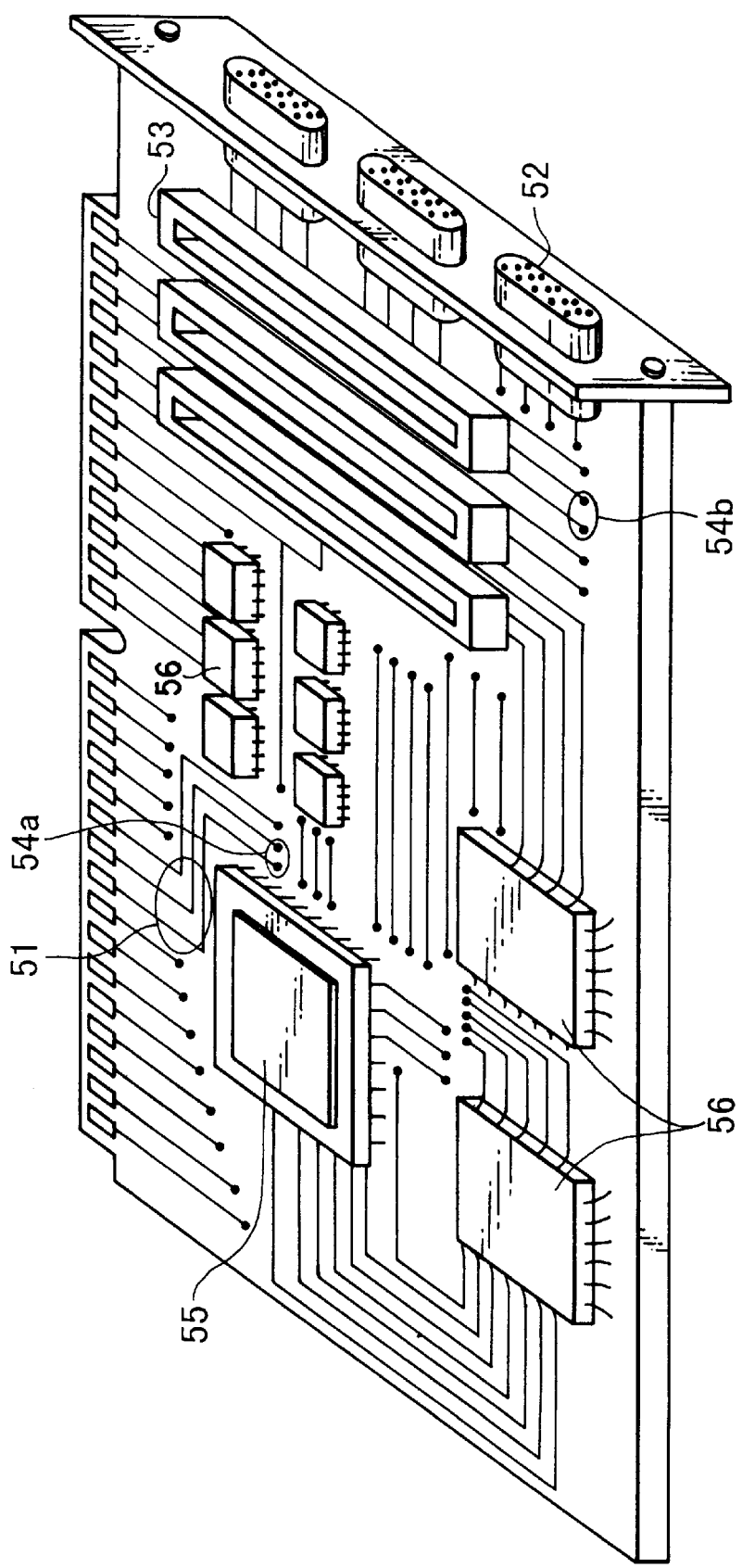
FIG. 25 is a perspective view of a CPU module according to a ninth embodiment of the present invention.

FIG. 25 is a perspective view of a CPU module according to a ninth embodiment of the present invention.

The CPU is characterized in that undesired electromagnetic waves, radiating from a clock signal wire 51, are controlled using the undesired electromagnetic waves control technique according to the first four embodiments of the present invention, undesired electromagnetic waves, radiating from a connector for cable 52 and a connector for sub-board 53, are controlled using the undesired electromagnetic waves control technique according to the fifth embodiment of the present invention, undesired electromagnetic waves, radiating from a through hole portion 54a, for linking the clock signal wire 51 to a high-speed data wire (not shown in the diagram), and a through hole portion 54b, for linking the connector for sub-board 53 to a high-speed data wire (not shown in the diagram), are controlled using the undesired electromagnetic waves control technique according to the sixth and seventh embodiments of the present invention, and undesired electromagnetic waves radiating from an LSI package 55 are controlled using the undesired electromagnetic waves control technique according to the eighth embodiment of the present invention.

According to the present embodiment, by controlling undesired electromagnetic waves radiating from the clock signal wire 51, the connectors 52 and 53, the through hole portions 54a and 54b, and the LSI package 55, which are main sources generating undesired electromagnetic waves, radiation of undesired electromagnetic waves from the CPU module can be effectively and adequately reduced. In FIG. 25, 56 represents an IC.

Here, the explanation referred to a CPU module, but the present invention can be applied to other semiconductor modules.

Furthermore, although the present embodiment described a case where the first four embodiments, characterized by techniques for controlling undesired electromagnetic waves radiating from a signal wire, the fifth embodiment, characterized by a technique for controlling undesired electromagnetic waves radiating from a connector, the sixth and seventh embodiments, characterized by techniques for controlling undesired electromagnetic waves radiating from a through hole portion, and the eighth embodiment, characterized by a technique for controlling undesired electromagnetic waves radiating from a semiconductor package, were all combined, undesired electromagnetic waves can be effectively reduced more than in the conventional technology even by combining two or three of these embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A wiring board, comprising:
   a first signal wire provided on a substrate and supplied with an input signal; and
   a pair of second signal wires provided along both sides of said first signal wire on said substrate and supplied with an inverse signal of said input signal;
   wherein an amplitude V1 of said input signal and an amplitude V2 of said inverse signal satisfy a relation $0.3\ V1 \leq V2 \leq 0.8\ V1$.

2. The wiring board according to claim 1, further comprising:
   a third signal wire provided out of said pair of said second signal wires on said substrate; and
   a fixed-potential wire provided between said third signal wire and one of said second wires on said substrate.

3. The wiring board according to claim 1, further comprising:
   a fixed-potential layer provided in said substrate.

4. The wiring board according to claim 1, wherein said input signal comprises a clock signal.

5. The wiring board according to claim 1, further comprising:
   a connector provided on said substrate, and having a first terminal connected to said first signal wire and a second terminal provided next to said first terminal;
   wherein said input signal is applied to said first terminal and said inverse signal is applied to said second terminal.

6. The wiring board according to claim 5, further comprising:
   a conductive film provided in said connector in order to match impedance between said first and said second terminal and signal wires connected thereto.

7. The wiring board according to claim 5, wherein said connector is a flat cable connector.

8. The wiring board according to claim 5, wherein said input signal comprises a clock signal.

9. The wiring board according to claim 1, further comprising:
   a first through hole portion provided in said substrate and supplied with said input signal; and
   a second through hole portion provided in said substrate next to said first through hole portion and supplied with said inverse signal.

10. The wiring board according to claim 9, wherein a signal-applied path in said first and second through hole portions comprises laminated multiple bumps.

11. The wiring board according to claim 9, further comprising:
    a conductive film provided to inner walls of said first and second through holes.

12. The wiring board according to claim 9, wherein said first through hole portion connects to a clock wire.

13. The wiring board according to claim 1, further comprising:
    a semiconductor package for mounting a semiconductor chip provided on said on said substrate, said semiconductor package having a first signal input portion and a second signal input portion;
    wherein said input signal is applied to said first signal input portion and said inverse signal of said input signal is applied to said second input signal portion.

14. The wiring board according to claim 13, wherein said input signal comprises a clock signal.

15. A semiconductor module, comprising:
    a first signal wire provided on a substrate and supplied with an input signal; and
    a pair of second signal wires provided along both sides of said first signal wire on said substrate and supplied with an inverse signal of said input signal;
    wherein an amplitude V1 of said input signal and an amplitude V2 of said inverse signal satisfy a relation $0.3\ V1 \leq V2 \leq 0.8\ V1$.

* * * * *